(12) United States Patent
Möster et al.

(10) Patent No.: US 6,307,934 B1
(45) Date of Patent: Oct. 23, 2001

(54) MULTICONNECTOR FOR MOBILE TELEPHONES

(75) Inventors: Erik Möster; Paul Larsson; Mats Olsson, all of Malmö ; Olof Simonsson, Lund; Mats Larsson; Rafael Portela, both of Malmö, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/324,833

(22) Filed: Jun. 3, 1999

(51) Int. Cl.[7] ..................................................... H04M 1/00
(52) U.S. Cl. ..................................... 379/438; 379/433.05
(58) Field of Search ................................... 379/428, 433, 379/438; 455/90, 575; 439/63, 74

(56) References Cited

U.S. PATENT DOCUMENTS

| | | |
|---|---|---|
| 4,636,591 | 1/1987 | Kuhfus et al. . |
| 4,675,903 | 6/1987 | Gulezian et al. . |
| 5,190,461 | 3/1993 | Oorui et al. . |
| 5,812,660 | * 9/1998 | Suzuki et al. ........................ 379/430 |
| 5,836,790 | 11/1998 | Barnett . |

FOREIGN PATENT DOCUMENTS

| | | |
|---|---|---|
| 2 087 080 | 1/1993 | (CA) . |
| 198 02 552 | 9/1998 | (DE) . |
| 0 609 744 | 8/1994 | (EP) . |
| 0 701 303 | 3/1996 | (EP) . |
| 0 827 360 | 3/1998 | (EP) . |
| 0 828 320 | 3/1998 | (EP) . |
| 0 840 396 | 5/1998 | (EP) . |
| 2 316 814 | 8/1996 | (GB) . |
| 04-043725 | 2/1992 | (JP) . |
| 05 343136 | 12/1993 | (JP) . |
| 10 190803 | 7/1998 | (JP) . |
| 96/07221 | 3/1996 | (WO) . |
| 98/13981 | 4/1998 | (WO) . |

* cited by examiner

*Primary Examiner*—Jack Chiang
(74) *Attorney, Agent, or Firm*—Burns, Doane, Swecker & Mathis, L.L.P.

(57) ABSTRACT

A multiconnector for a handheld telephone includes connectors for a SIM card, an internal battery, and a microphone, as well as additional connectors for other external devices. The multiconnector is mounted to a printed circuit board (PCB) in the telephone and makes electrical contact between the connectors and the PCB. Incorporation of all of the connectors into a single, integral multiconnector simplifies manufacturing and reduces the number of components necessary to construct the telephone.

18 Claims, 1 Drawing Sheet

MULTICONNECTOR FOR MOBILE TELEPHONES

BACKGROUND OF THE INVENTION

1. Field of the Invention

The present invention relates to electromechanical connections, and more particularly to electromechanical connections with printed circuit boards in handheld telephone sets.

2. Brief Description of the Related Art

The design of portable telephones has evolved along several different lines. This evolution can be characterized in part by a miniaturization of the components of the telephone, and therefore of the telephone itself. Other advances in, e.g. battery technologies, have allowed handheld telephones to be used longer without requiring recharging of the external battery.

In typical handheld telephones, an external battery is removably mounted to the telephone housing. With the development of Subscriber Identity Module (SIM) card technologies, it has become convenient to mount the SIM card in a recess in the telephone housing over which the external battery was then mounted. While providing a convenient location for installing and removing SIM cards, this solution is not without its drawbacks. The external battery can be dislodged, exposing the sensitive SIM card and its associated electrical connections to external contaminants such as dirt, dust, and moisture. Furthermore, the placement of the SIM card's receiving recess in the external battery recess requires complex, and therefore costly, printed circuit board (PCB) design in order to connect the SIM card and external battery to the PCB's electronic components. With the further advances of external adaptive devices, such as battery chargers and system connections, including external microphones and speakers, the design and layout of the PCB and its associated electromechanical connectors has become increasingly complicated, distributed, and costly to assemble.

Further improvements in battery technologies allow for handheld telephones to be supplied power by an internal battery, that is, a battery that is housed within the telephone's shells, and which is not readily removable for replacement. While the use of such internal batteries will lead to further improvements in telephone design, the elimination of the external battery and it's mounting recess in the telephone's housing creates a need for a protected location in or on the telephone for placement of a SIM card recess. Prior handheld telephone's have not provided a solution to this problem.

Prior handheld telephone designs have also suffered from deficiencies in their layout and design by not minimizing the number of components that must be assembled together to construct the telephone. Thus, prior devices have been unnecessarily expensive to assembly, requiring additional steps to solder and otherwise join the many subcomponents together. This also leads to increases in assembly time, and the possibility of greater rejection rates with higher numbers of assembly steps.

Examples of prior handheld telephones and electrical connectors include EP 840 396 A1, JP 4-043 725, GB 2 316 814, EP 827 360 A2, WO 98/13981 A1, U.S. Pat. No. 4,636,591, U.S. Pat. No. 4,675,903, EP 609 744 A1, EP 701 303 A2, WO 96/07221 A1, EP 828 320 A1, and CA 2 087 080 A, all of which are incorporated by reference in their entireties herein.

SUMMARY OF THE INVENTION

Prior telephone handsets suffer from numerous deficiencies, including incompatibilities with emerging battery technologies, excessive numbers of subcomponents, and overly distributed component design.

The present invention addresses failings in the prior art by providing an integral multiconnector which integrates together several connectors for a telephone handset for connection to a PCB. According to exemplary embodiments of the present invention, several electromechanical connector components of the handset are integrated into one part, a multiconnector. The multiconnector preferably contains connectors for a system connector, a SIM unit, a battery connector, a battery charger, and a microphone connector. The multiconnector can be mounted to a PCB by a push fitting or an automated soldering process, and can include a variety of types of connector elements, e.g., pogo pins, spring connectors, or the like. By providing all of these electromechanical components and connectors into a single, integral multiconnector, manufacturing can be simplified because fewer steps are required to assemble these several subcomponents with the PCB. The total number of subcomponents is therefore minimized, and the process of assembling a handset incorporating a multiconnector in accordance with the present invention can be further, or completely, automated. Additionally, by incorporating an electromechanical interface or connector for an internal battery into the multiconnector, emerging battery technologies can be readily used with the multiconnector when an internal battery alone is used to provide power to a mobile telephone handset.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus and method, given only by way of example, and with reference to the accompanying drawings, in which.

DESCRIPTION OF THE PREFERRED EMBODIMENTS

Figure 1:
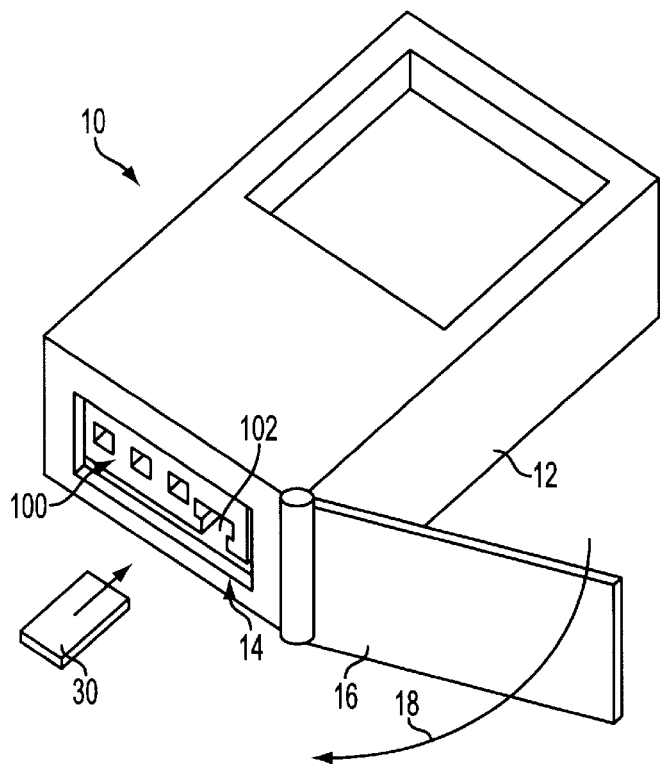
FIG. 1 is an illustration of a perspective view of a device incorporating a multiconnector in accordance with the present invention.

Referring to the drawing figures, like reference numerals designate identical or corresponding elements throughout the several figures.

FIG. 1 illustrates a perspective view of a device, preferably a handheld wireless telephone 10, incorporating a multiconnector 100 in accordance with the present invention. Multiconmector 100 is mounted or otherwise connected to a printed circuit board (PCB) 20 (not illustrated in FIG. 1; see FIGS. 2 and 3) which is mounted in the phone 10.

Multiconnector 100 includes a plurality of electromechanical connectors which are accessible through the outer shell(s) 12 of the phone, which allow the phone to be connected to a number of internal and external devices such as system connectors (not illustrated), SIM cards 30, an internal battery (not illustrated), external power deliver devices (not illustrated), battery chargers (not illustrated), microphones (not illustrated), and the like. Preferably, shell (s) 12 act as a housing and contains all of the electronic and mechanical components of phone 10, and includes an opening 14 by and through which the aforementioned external devices may be plugged into multiconnector 100 to function with the phone. Phone 10 preferably also includes a door, flip cover, false face plate, or the like, 16, in order to prevent dirt, dust, or other contaminants from entering into the interior of shell 12 through opening 14, which may cause malfinctioning of electrical devices therein. Thus, once a SIM card has been inserted into a corresponding connector 102, flip cover can be closed over opening 14, as suggested by arrow 18.

Figure 2:
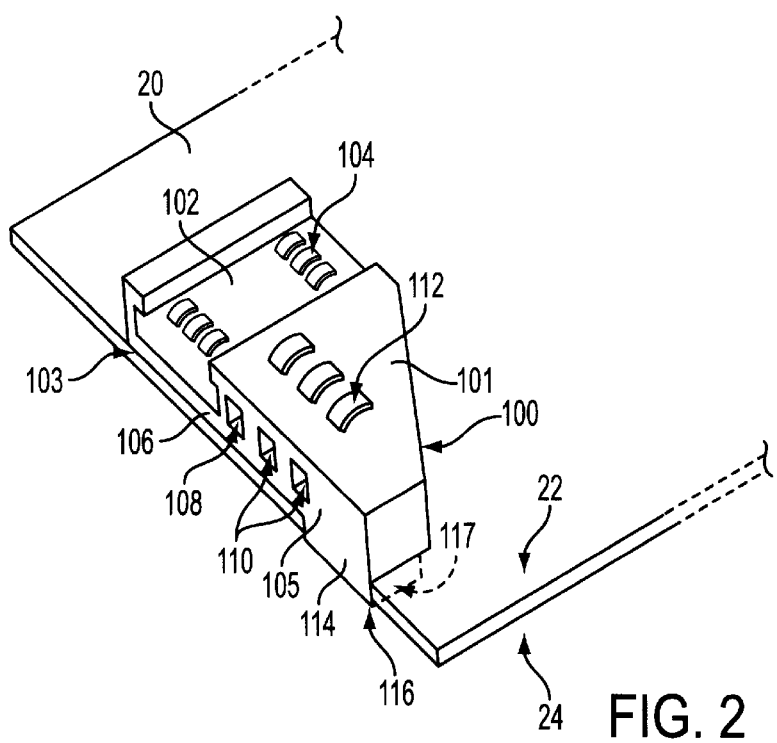
FIG. 2 is an illustration of a perspective view of a multiconnector in accordance with the present invention mounted to a printed circuit board.

FIG. 2 illustrates a perspective view of a multiconnector 100 in accordance with the present invention, mounted to a PCB 20 of a phone 10. Relative to the perspective view illustrated in FIG. 1, FIG. 2 is upsidedown. PCB 20 can include circuits, microprocessor devices, and the like (not illustrated), as will be readily appreciated by one of ordinary skill in the art, which allow phone 10 to function. Multiconnector 100 includes electrical pathways (not illustrated) therethrough from the several connectors which are integrally formed in the multiconnector to electrical contacts (not illustrated) which are in physical and electrical contact with PCB 20. Multiconnector 100 is press-fit, soldered, or otherwise attached to PCB 20, preferably in an automated process, so that the several electrical connectors of the multiconnector are in electrical communication with corresponding electrical circuit elements on the PCB, as will be readily appreciated by one of ordinary skill in the art. PCB 20 includes a primary side 22 to which multiconnector 100 is primarily attached, and a secondary side 24. Multiconnector 100 includes a top surface 101, a bottom surface 103 opposite the top surface, and a front surface 105 which is intended to face out of a mobile telephone handset, as suggested in FIG. 1. As described in greater detail below, several connectors of multiconnector 100 are formed in or include portions which are formed in front surface 105.

Multiconnector 100 includes a SIM card connector 102 which is sized and shaped to matingly receive SIM card 30 (see FIG. 1) therein Connector 102 includes a plurality of electrical contacts 104 which are positioned in connector 102 sot that, when a SIM card is inserted into connector 102, contacts 104 are placed in electrical communication with correspondingly shaped and positioned electrical contacts on the SIM card (not illustrated). The details of SIM card design and construction are well known to one of ordinary skill in the art, and therefore a working knowledge of such device and arts is herein assumed and will not be further discussed. For further reference, see U.S. Pat. Nos. 4,889,498, 5,061,845, 5,687,216, and 5,790,659, all of which are incorporated by reference herein in each of their entireties.

Multiconnector 100 also preferably includes several connectors formed adjacent to connector 102 in a front face 106 of the multiconnector. By way of example, a battery charger connector 108 and a system connector 110 are formed in front face 106, which allow connection of a battery charger (not illustrated) and system interconnect (not illustrated), respectively. As will be readily appreciated by one of ordinary skill in the art, additional, fewer, or even no electrical connection sockets may be provided in addition to connector 102 on front face 106, in order to provide more functionality or, conversely, simpler construction of multiconnector 100.

Multiconnector 100 includes a battery connector 112 which allows a battery, preferably an internal battery (not illustrated) of phone 10, to be placed in electrical power communication with PCB 20, to provide power to the electrical and electronic components of the phone. As battery technologies improve, it will not be necessary to provide phone 10 with an external connection through which an external battery can communicate with the circuitry of the phone, but instead the phone can be provided with an internal battery (not illustrated). Of course, batteries which are presently available can serve this fiction and be mounted inside shell 12 of phone 10, with the service life of the battery being the only limiting factor the use of current batteries.

Thus, a multiconnector in accordance with the present invention preferably includes connector 112 for connecting to an internal battery of phone 10, and also includes at least SIM card connector 102, and optionally additional electromechanical connectors, so that all of the external connections to the phone's PCB 20, and the battery connection, can be made through the multiconnector. All of these connectors are integrally formed in a single-piece, monolithic form which makes up multiconnector 100, so that a single assembly step can be used to join all of these connectors to PCB 20. In turn, the use of a multiconnector, such as multiconnector 100, which includes these internal and external connections greatly simplifies manufacturing of a phone 10, because automation of the process by which all of the internal and external connections are made is enhanced by integrating all of these connectors into a single multiconnector which is attached or mounted to PCB 20 at one time.

Figure 3:
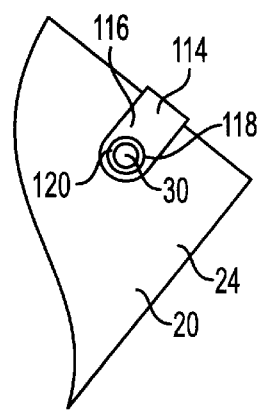
FIG. 3 is an illustration of a bottom plan view of the multiconnector and printed circuit board illustrated in FIG. 2.

Turning now to FIG. 3, and with continued reference to FIG. 2, multiconnector 100 includes an appendage, tab, or extension 114, which extends downward and includes portions 116 which wrap around PCB 20, so that extension 114 is in mechanical and electrical contact with secondary side 24 of the PCB. Stated differently, wrap around portions 116 forms a slot 117 between portions 116 and the main body of multiconnector 100 into which PCB 20 is inserted. A microphone 30 is retained in and by a gasket 120 in a recess 118 formed in wrap around portion 116. Wrap around portion 116, with recess 118 and gasket 120, holds microphone 30 against PCB 20, and in particular against secondary side 24, and places the microphone in electrical communication with a circuit element (not illustrated) on the PCB. Extension 114 also assists in holding multiconnector 100 to PCB 20, as will be readily appreciated by one of ordinary skill in the art. By providing wrap around portion 116, microphone 30 can be placed in close proximity to the top portions of shell 12 (see FIG. 1), so that the microphone used more effectively through apertures formed in the shell (not illustrated).

While the invention has been described in detail with reference to preferred embodiments thereof, it will be apparent to one skilled in the art that various changes can be made, and equivalents employed, without departing from the scope of the invention.

What is claimed is:

1. A multiconnector useful in a cellular telephone handset, comprising:

a single-piece, monolithic form having a top surface, a bottom surface, and a front surface;

a SIM card connector integrally formed into said monolithic form; and an internal battery connector integrally formed into said monolithic form;

wherein said monolithic form comprises a main body, an extension extending away from said main body and away from said monolithic form bottom surface, and a slot between said bottom surface and said extension, said slot sized and configured to accept a portion of a printed circuit board therein.

2. A multiconnector in accordance with claim 1, further comprising a microphone unit integrally formed into said monolithic form.

3. A multiconnector in accordance with claim 1, wherein said extension comprises a microphone unit therein.

4. A multiconnector in accordance with claim 1, further comprising a connector for an external power source integrally formed into said monolithic form front surface.

5. A multiconnector in accordance with claim 1, further comprising a system connector integrally formed into said monolithic form front surface.

6. A multiconnector in accordance with claim 1, wherein said SIM card connector includes portions opening into said front surface.

7. A multiconnector in accordance with claim 1, wherein said internal battery connector is positioned on said monolithic form top surface.

8. A multiconnector useful in a cellular telephone handset, comprising:

single-piece, monolithic connector means having a top surface, a bottom surface, and a front surface;

SIM card connector means integrally formed into said monolithic connector means; and internal battery connector means integrally formed into said monolithic connector means;

wherein said monolithic connector means comprises a main body, an extension extending away from said main body and away from said monolithic connector means bottom surface, and a slot between said bottom surface and said extension, said slot sized and configured to accept a portion of a printed circuit board therein.

9. A multiconnector in accordance with claim 8, further comprising microphone means integrally formed into said monolithic connector means.

10. A multiconnector in accordance with claim 8, wherein said extension comprises microphone means therein.

11. A multiconnector in accordance with claim 8, further comprising external power source connector means integrally formed into said monolithic connector means front surface.

12. A multiconnector in accordance with claim 8, further comprising system connector means integrally formed into said monolithic connector means front surface.

13. A multiconnector in accordance with claim 8, wherein said SIM card connector means includes portions opening into said front surface.

14. A multiconnnector in accordance with claim 8, wherein said internal battery connector means is positioned on said monolithic connector means top surface.

15. A mobile telephone handset comprising:

a housing sized to contain electronic components of said mobile telephone;

a printed circuit board in said housing; and a single-piece, monolithic multiconnector in said housing and having a top surface, a bottom surface, and a front surface, said monolithic multiconnector mounted to said printed circuit board and in electrical communication with said printed circuit board, said monolithic multiconnector including:

a SIM card connector integrally formed into said monolithic multiconnector; and an internal battery connector integrally formed into said monolithic multiconnector;

wherein said monolithic multiconnector further comprises a main body, an extension extending away from said main body and away from said monolithic multiconnector bottom surface, and a slot between said bottom surface and said extension, a portion of said printed circuit board received in said slot.

16. A mobile telephone handset in accordance with claim 15, wherein said housing comprises a opening therein said printed circuit board and said monolithic multiconnector positioned in said housing with said monolithic multiconnector front surface immediately adjacent to said opening so that a SIM card can be inserted through said opening and into said SIM card connector.

17. A mobile telephone handset in accordance with claim 15, further comprising a door connected to said housing movable between a closed position covering said housing opening and an open position exposing said monolithic multiconnector front surface.

18. A mobile telephone handset in accordance with claim 15, wherein said extension comprises a microphone unit therein in electrical communication with said printed circuit board.

* * * * *